United States Patent [19]
Machida

[11] Patent Number: 5,334,936
[45] Date of Patent: Aug. 2, 1994

[54] MAGNETIC RESONANCE IMAGING APPARATUS

[75] Inventor: Yoshio Machida, Tochigi, Japan

[73] Assignee: Kabushiki Kaisha Toshiba, Kawasaki, Japan

[21] Appl. No.: 938,834

[22] Filed: Aug. 31, 1992

[30] Foreign Application Priority Data

Sep. 3, 1991 [JP] Japan .................. 3-222883

[51] Int. Cl.$^5$ .............................................. G01V 3/00
[52] U.S. Cl. ........................................ 324/309; 324/314
[58] Field of Search ............... 324/314, 309, 307, 300, 324/313; 128/653.2, 653.5

[56] References Cited

U.S. PATENT DOCUMENTS

| 4,443,760 | 4/1984 | Edelstein et al. | 324/314 |
|---|---|---|---|
| 4,698,592 | 10/1987 | Feinberg | 324/309 |
| 4,714,884 | 12/1987 | Glover | 324/309 |
| 4,873,487 | 10/1989 | Van Der Meulen | 324/314 |
| 4,959,611 | 9/1990 | Provost et al. | 324/309 |
| 5,027,072 | 6/1991 | Rinaldi | 324/312 |
| 5,245,283 | 9/1993 | Provost et al. | 324/309 |

FOREIGN PATENT DOCUMENTS

| A0098479 | 1/1984 | European Pat. Off. . |
|---|---|---|
| A0253446 | 1/1988 | European Pat. Off. . |
| A357100 | 3/1990 | European Pat. Off. . |
| A3636251 | 7/1987 | Fed. Rep. of Germany . |

Primary Examiner—Louis Arana
Attorney, Agent, or Firm—Limbach & Limbach

[57] ABSTRACT

In a magnetic resonance imaging apparatus adapted for a spin-echo method using a 90° pulse as a selective excitation pulse and a 180° pulse as a refocus pulse, MR signal is acquired with their phase difference changed in increments of a fixed angle with each frequency encoding step. This permits the phase difference between an echo signal used for imaging and an FID signal unnecessary for imaging to be changed in increments of the fixed angle with each encoding step. Thus, a zipper artifact based on the FID signal will be produced in a position corresponding to the fixed angle in an MR image reconstructed through Fourier transform of the acquired signal. The proper setting of the fixed angle of the phase difference permits the zipper artifact to be shifted to any position in the MR image.

12 Claims, 7 Drawing Sheets

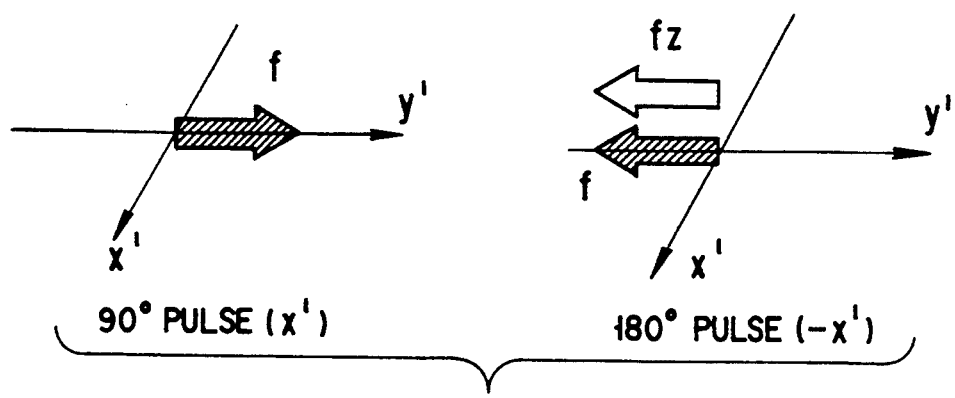
FIG. 3B (PRIOR ART)
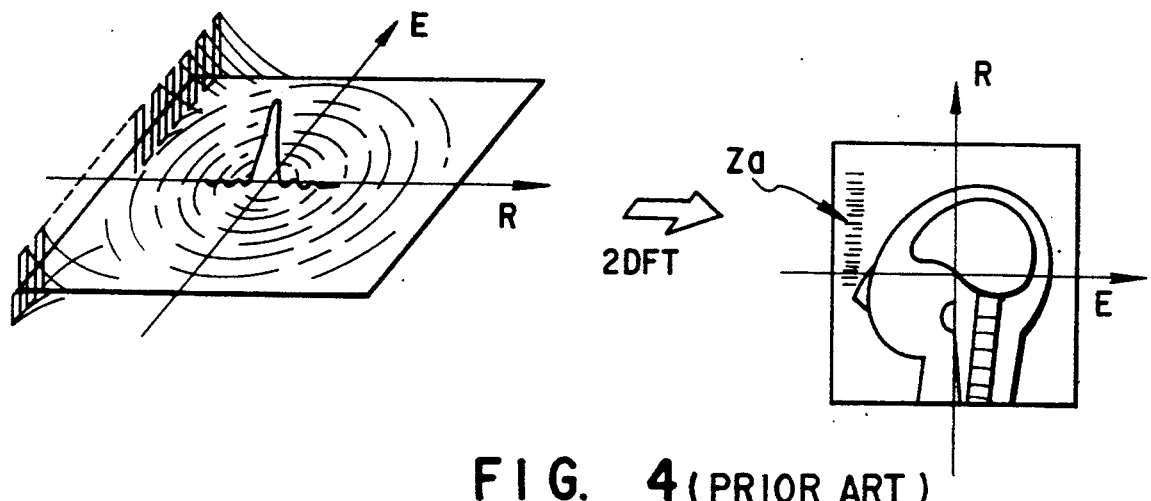
FIG. 4 (PRIOR ART)
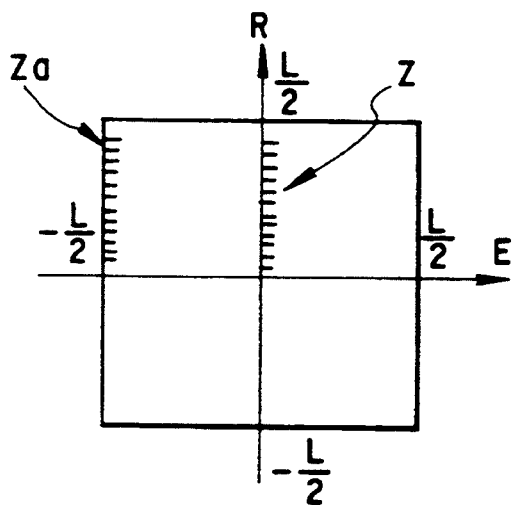 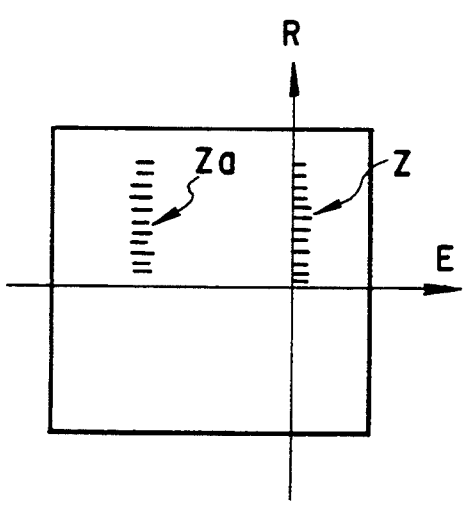
FIG. 5A (PRIOR ART)     FIG. 5B (PRIOR ART)

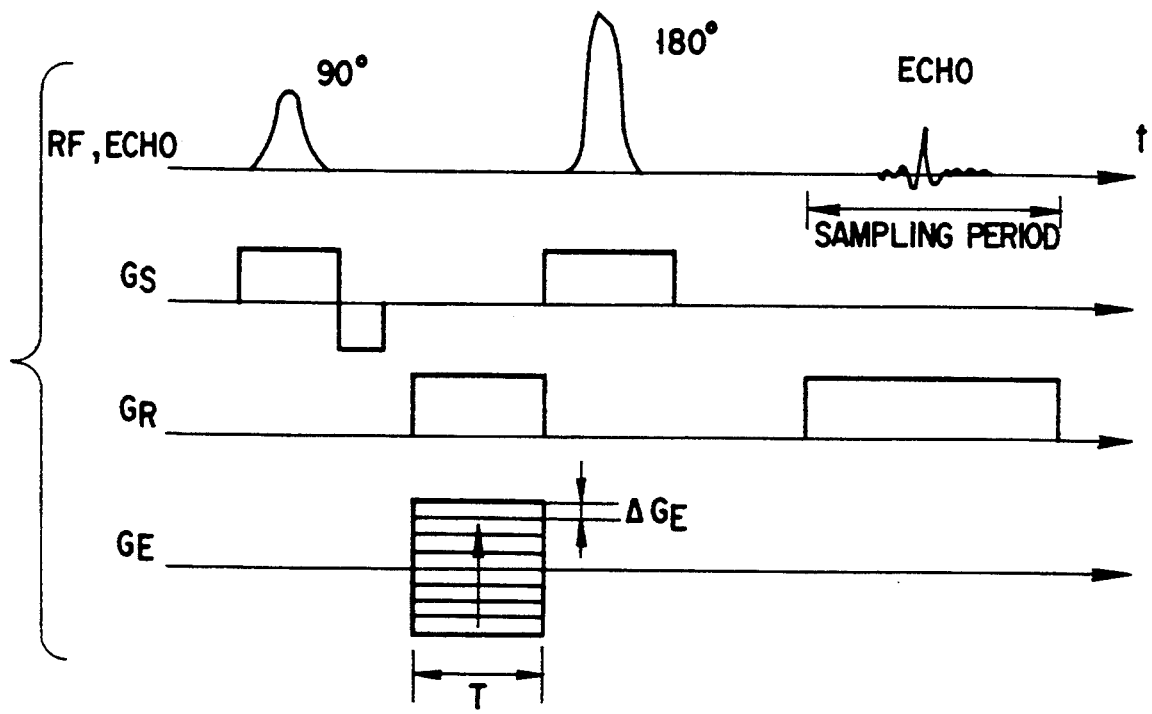
F I G. 6 (PRIOR ART)
F I G. 9
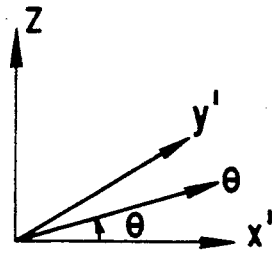
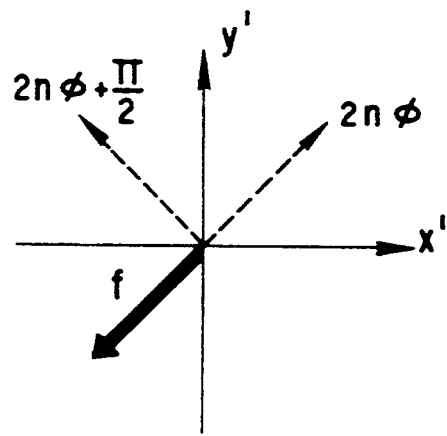
F I G. 10A
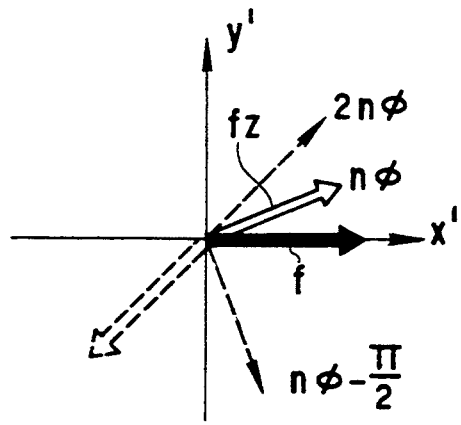
F I G. 10B

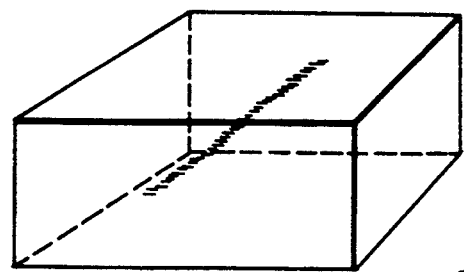
FIG. 14
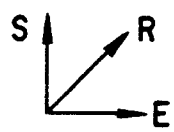
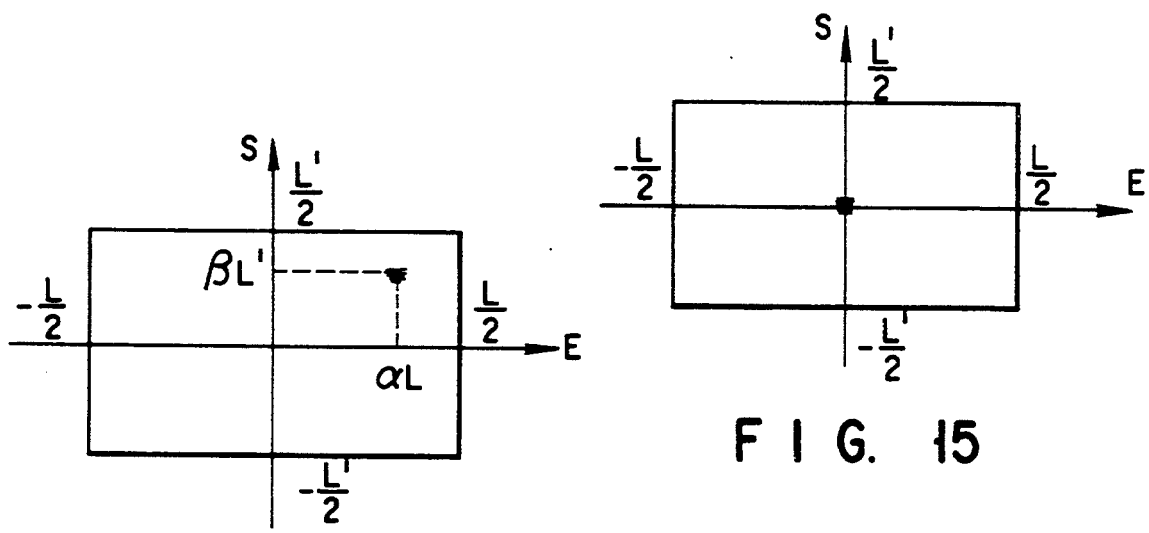
FIG. 15
FIG. 16
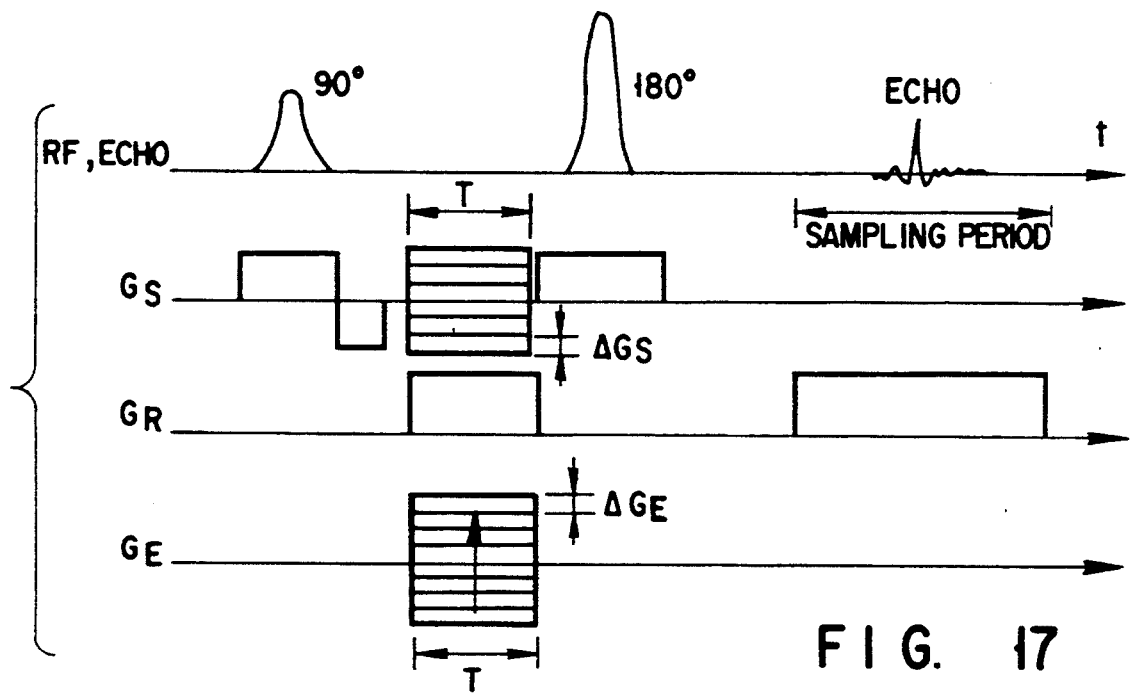
FIG. 17

MAGNETIC RESONANCE IMAGING APPARATUS

BACKGROUND OF THE INVENTION

1. Field of the Invention

The present invention relates to a magnetic resonance imaging apparatus which suffers little from degradation in image quality due to image artifacts caused by unwanted signals other than magnetic resonance signals.

2. Description of the Related Art

As such an image artifact there is known what is referred to as a zipper artifact which, in a spin-echo imaging pulse sequence, for example, is caused by a free induction decay (FID) signal caused by a 180° pulse mixed in a spin-echo signal (hereinafter referred simply to as an echo signal) obtained as a desired magnetic resonance signal.

FIG. 1 is a schematic representation of the manner in which an FID signal is mixed in an echo signal during its sampling period. In a spin-echo imaging pulse sequence, insufficient selective excitation of a rectangular region by a 180° pulse causes such a leakage component of the FID signal as shown in FIG. 1. The leakage component, combined with the echo signal, produces an artifact on a MR (magnetic resonance) image.

The principle of the production of the image artifact is illustrated in FIG. 2. On the Fourier space (k-space) an FID signal has several frequency components in the readout direction R but only a direct-current component in the phase-encoding direction E. Thus, on an image obtained through two-dimensional Fourier-transform of an echo signal, an artifact Z will be produced at the center (in the neighborhood of the zero frequency in the encoding direction) of the image in such a shape as shown. This type of artifact is variously called "zipper artifact" on account of its shape, or "flow-in artifact". In this specification the artifact is called the zipper artifact.

For the purpose of explaining the cause of the production of the zipper artifact, suppose here that the zipper artifact is represented by Z, and a mixed-in signal (a flow-in signal; here an FID signal) which causes the artifact is represented by fz.

The following methods are known which prevent the production of a zipper artifact.

(1) A method by which a gradient magnetic field called a spoiler is applied after a 180° pulse, thereby reducing an FID signal fz.

This method suffers from drawbacks that the imaging time becomes long and a pulse sequence used becomes complicated because the application of an additional gradient field is needed.

(2) A method by which, in the case of a pulse sequence in which the same echo signal is acquired several times for averaging, the relative direction of an echo signal f and an FID signal fz is reversed each time data is acquired, and their mean values are calculated, thereby canceling the FID signal fz out. This method cannot be used with a pulse sequence in which the number of data acquisitions per encoding step is one.

In order to carry out the method (2), it is only required that the phases of RF pulses be changed with each data acquisition as shown in FIGS. 3A and 3B. FIG. 3A illustrates a case where the phase of each of the 90° and 180° RF pulses in the spherical coordinate system is coincident with x' (x' indicates the x axis in the rotating coordinate system). In this case, an acquired signal Fa will be represented by f−fz with the echo signal f taken as a reference. FIG. 3B illustrates a case where the phase of a 90° pulse is coincident with x', and the phase of a 180° pulse is coincident with −x', in which case an acquired signal Fb will be represented by f+fz. As a result, the FID signal fz can be canceled out by obtaining the arithmetic mean of the acquired signals $(=(\frac{1}{2})\times(Fa+Fb)=f)$ with the phase of the 90° pulse kept at x' and the phase of the 180° pulse alternated between x' and −x' with each data acquisition as shown in FIGS. 3A and 3B.

According to method (2), the FID signal fz alternates between being in the opposite direction (FIG. 3A) to and being in the same direction (FIG. 3B) as the echo signal f. With the echo signal f taken as a reference, the component of the FID signal fz in the encoding direction becomes the highest-frequency component. This is illustrated in FIG. 4.

In this way, by changing the phases of the RF pulses with each data acquisition (i.e., with each encoding step) so that the direction of the FID signal fz is reversed, the position where the zipper artifact is produced can be shifted from the center of an MR image to its peripheral part (the neighborhood of the Nyquist frequency (highest frequency) in the encoding direction). For this reason, the artifact, which will not disappear from the image, is produced in a peripheral part of the image that is little important for observation, which allows the influence of the artifact on the image to be disregarded practically. In this case, the zipper artifact Za is produced in a position at a distance of L/2, corresponding to the Nyquist frequency defined by a phase encoding quantity, from the center of gradient magnetic fields, as shown in FIG. 5A.

At this point, suppose that parameters in the pulse sequence are defined as shown in FIG. 6. Then, L is given by:

$$T\times \Delta GE\times L=1 \qquad (1)$$

where

T: length of time that a phase-encoding gradient magnetic field is applied in the encoding direction, seconds $\Delta GE$: unit step in the encoding direction, Hz/cm L: image field in the encoding direction, centimeters Consider now a case where it is desired to obtain an image with a region of interest of a patient as its center when the region of interest is at a distance from the center of the magnetic field, i.e., an off-center image. In this case, however, a problem will arise in that the zipper artifact Za shifted to the peripheral part appears in the neighborhood of the image center as shown in FIG. 5B as a result of shifting of the field center. The original zipper artifact Z that makes no shift to the peripheral part of the image will also be produced in a position in the image that is unfavorable for observation.

The above description was made in connection with zipper artifacts in two-dimensional space. The same problems will arise in the case of artifacts in three-dimensional space.

SUMMARY OF THE INVENTION

It is therefore an object of the present invention to provide a magnetic resonance imaging apparatus which permits a zipper artifact based on signals unnecessary for imaging to be shifted to any position in an MR image of an object under examination.

A magnetic resonance imaging apparatus according to the present invention, in acquiring magnetic resonance signals from an object under examination to obtain an MR image of the object, acquires a first signal used for imaging and a second signal unnecessary for imaging with their phase difference changed in increments of a predetermined angle with each frequency encoding step. Thereby, the relative positional relationship between an image obtained from the first signal and an image obtained from the second signal can be made dependent on the phase difference.

According to the magnetic resonance imaging apparatus of the present invention, the image based on the second signal can be shifted to any position, in the MR image based on the first signal, which is determined by the phase difference between the first and second signals. This permits off-center imaging of the subject under examination in which a region of interest is off the center of magnetic fields, thus preventing diagnosis from being affected by a zipper artifact.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 3A and 3B are diagrams for use in explanation of the principle on which the zipper artifact is produced;

FIG. 4 illustrates a shift of position where a zipper artifact is produced in a prior art;

FIGS. 5A and 5B illustrate positions where zipper artifacts are produced in a case where an off-center image is obtained at the time of shifting of position where a zipper artifact is produced in the prior art;

FIG. 6 illustrates a typical pulse sequence in a spin-echo method;

FIG. 9 illustrates the coordinate system for use in explanation of the operation of the first embodiment;

FIGS. 10A and 10B illustrate the principle of a shift of position where a zipper artifact is produced in accordance with the first embodiment;

FIG. 14 illustrates the position where a three-dimensional zipper artifact is produced in a fourth embodiment of the present invention;

FIG. 15 illustrates the position where the zipper artifact is produced in FIG. 14 when viewed from a plane formed of a phase encode axis and a slice axis;

FIG. 16 is a diagram for use in explanation of a shift of the position where a zipper artifact is produced in accordance with the fourth embodiment; and FIG. 17 illustrates a pulse sequence used in the fourth embodiment.

DETAILED DESCRIPTION OF THE PREFERRED EMBODIMENTS

Figure 7:
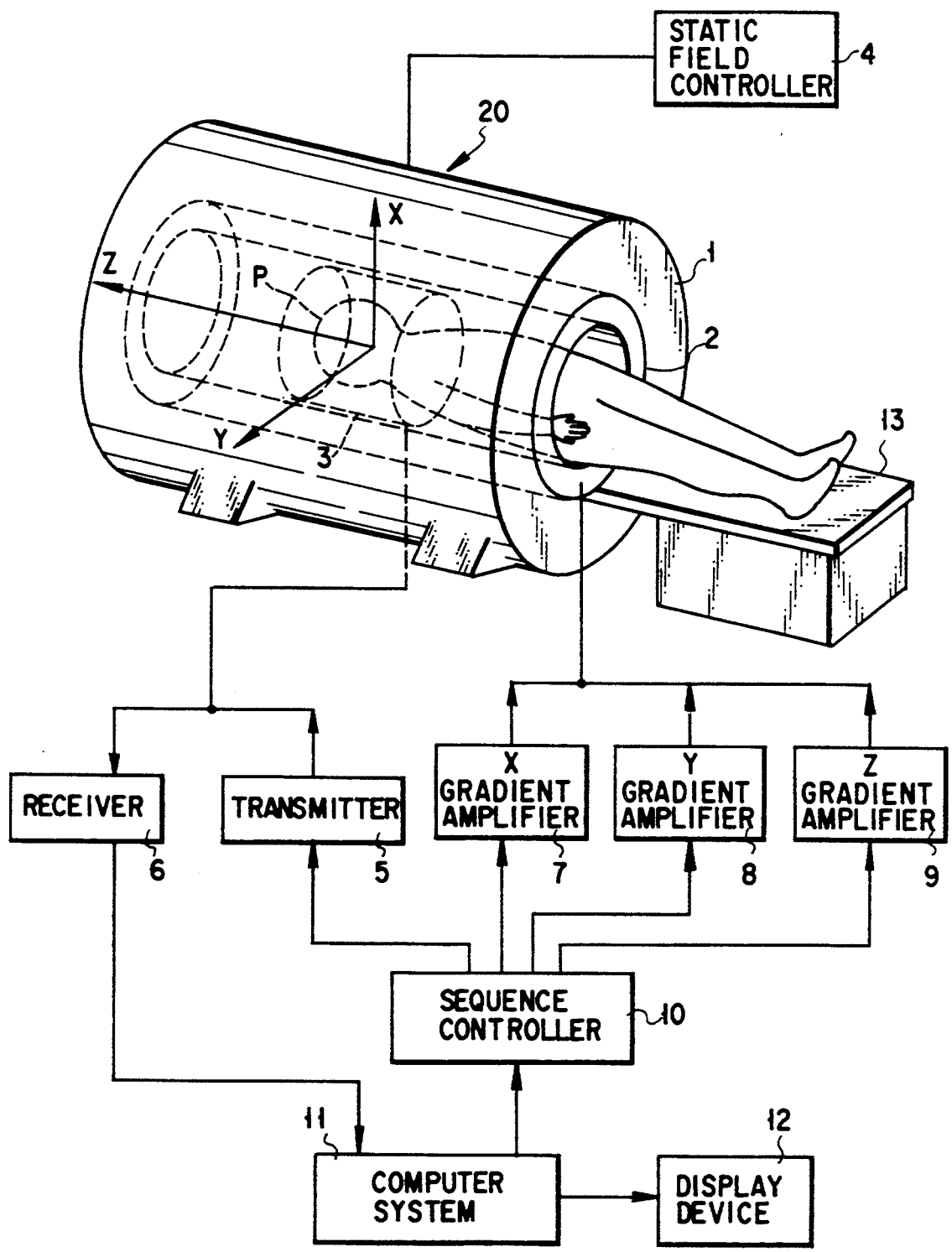
FIG. 7 is a block diagram of a first embodiment of a magnetic resonance imaging apparatus according to the present invention.

A preferred embodiment of a magnetic resonance imaging apparatus according to the present invention will now be described with reference to the accompanying drawings. FIG. 7 schematically illustrates a magnetic resonance imaging apparatus according to a first embodiment of the present invention in block form. A static magnetic field forming magnet 1, an x-axis, y-axis, and z-axis gradient magnetic fields forming coil system 2, and a transmitter/receiver coil system 3 are installed in a gantry 20. The transmitter/receiver coil 3 may be directly attached to a human body P under examination instead of being embedded in the gantry.

The magnet 1, serving as a means of forming a static magnetic field, can be constructed of a superconducting or normal-conducting coil, The x-axis, y-axis, and z-axis gradient fields forming coil system 2 is adapted to generate an x-axis gradient field Gx, a y-axis gradient field Gy, and a z-axis gradient field Gz. The transmitter/receiver coil 3 emits a radio-frequency (RF) pulse serving as a selective excitation pulse for selecting a slice to be imaged of the human body P and detects a magnetic resonance signal (echo signal) generated by magnetic resonance induced in the selected slice. The human body P, laid down an examination couch 13, is allowed to have access to the imaging space within the gantry 20. The imaging space is a spherical space in which imaging magnetic fields are formed, and imaging diagnosis can be made only when an imaging portion of the human body lies within this space.

The static magnetic field forming magnet 1 is driven by a static field controller 4. The transmitter/receiver coil 3 is coupled to a transmitter 5 at the time of inducing magnetic resonance in the human body and to a receiver 6 at the time of detecting magnetic resonance signals from the human body. The x-axis, y-axis, and z-axis gradient fields forming coil system 2 is driven by x-axis, y-axis, and z-axis gradient field power supplies (amplifiers) 7, 8, and 9.

The x-axis, y-axis, and z-axis gradient field amplifiers 7, 8, and 9, and the transmitter 5 are driven by a sequence controller 10, thereby generating an x-axis gradient field Gx, a y-axis gradient field Gy, a z-axis gradient field Gz, and a radio-frequency (RF) pulse in accordance with a predetermined pulse sequence which will be described later. The gradient fields Gx, Gy, and Gz are used, for example, as a phase-encoding gradient field Ge, a readout gradient field Gr, and a slice-selection gradient field Gs, respectively. A computer system 11 drives and controls the sequence controller 10 and receives magnetic resonance signals from the receiver 6 for signal processing, thereby reconstructing a cross-sectional magnetic resonance (MR) image of the human body and displaying it on a display device 12.

Figure 8:
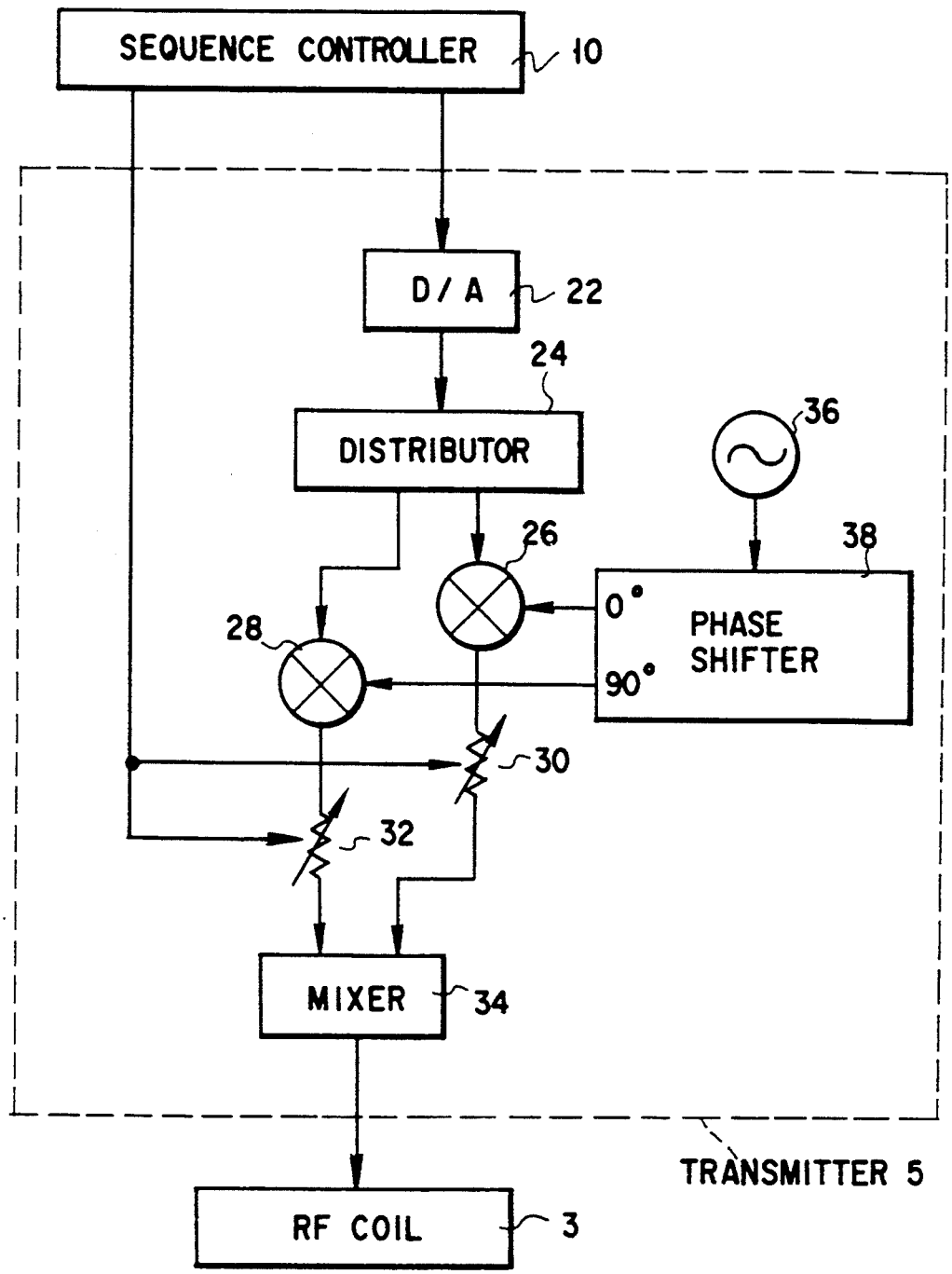
FIG. 8 is a detailed block diagram of the transmitter of FIG. 7.

FIG. 8 is a detailed block diagram of the transmitter 5. An RF transmit signal from the sequence controller 10 is applied to a distributor 24 via a D/A converter 22. The distributor 24 has two outputs. The distributor has its first output connected through a mixer 26 and a variable resistor 30 to one of inputs of a mixer 34 and its second output connected through a mixer 28 and a variable resistor 32 to the other input of the mixer 34. The output of the mixer 34 is coupled to the transmitter/receiver coil 3. The mixers 26 and 28 have their respective inputs connected to first and second outputs of a phase shifter 38, which is connected to an oscillator 36 and produces from its output signal two signals (a 0° signal and a 90° signal) which are in quadrature, i.e., 90° out of phase with each other. Thereby, a cosine component and a sine component of the transmit signal, which are in quadrature, are produced by the mixers 26 and 28. The magnitudes of the cosine and sine components of the transmit signal are controlled by the variable resistors 30 and 32, respectively. The resistance values (amounts of signal attenuation) of the variable resistors 30 and 32 are independently controlled by control signals from the sequence controller 10. This permits the phases of RF pulses to be transmitted from the transmitter/receiver coil 3 to be adjusted freely.

The present embodiment is featured by shifting a zipper artifact to any position in an image using the following technique to thereby lessen the influence of the zipper artifact on image quality. Suppose here that MR imaging is performed using a spin-echo pulse sequence. Preparatory to describing the embodiment, it is assumed that, as shown in FIG. 9, the coordinate system is represented by x', y', and z axes as usual. An axis obtained by rotating the x' axis toward the direction of the y' axis through an angle of ♭ is represented by the same symbol ♭.

RF pulses (a 90° pulse as a selective excitation pulse and a 180° pulse as a refocus pulse) in the spin-echo technique can be applied from any direction (at any phase) by adjusting the magnitudes of the two quadrature components (two sin and cos components), i.e., in the present embodiment, by adjusting the variable resistors 28 and 30 shown in FIG. 8. Let a 90° ($\pi/2$) pulse and a 180° ($\pi$) pulse applied from the $\theta$ direction be represented by $[\pi/2]_\theta$ and $[\pi]_\theta$, respectively.

In the present embodiment, by changing the phase difference between an echo signal essentially obtained by the spin-echo technique and an FID signal (leakage signal) due to a $\pi$ pulse in increments of a fixed angle with each data acquisition (with each encoding step), the position where a zipper artifact, resulting from two-dimensional Fourier transform of the leakage signal, is produced with respect to an image obtained through two-dimensional Fourier transform of the echo signal is shifted by an amount corresponding to the fixed angle. The pulse sequence is the same as the usual pulse sequence except that the phases of the RF pulses are changed with each encoding step. Where, for example, encoding is repeated a number N of times from $-(N/2)+1$ to $N/2$, the phases of the RF pulses in each encoding step n $(=-(N/2)+1$ to $N/2)$ are set by the use of the variable resistors 30 and 32 in the transmitter 5 as follows:

$[\pi/2]_{2n\phi-3\pi/2}$ $(=[\pi/2]_{2n\phi+\pi/2})$ $[\pi]_{n\phi-\pi/2}$ where
$\phi$: predetermined value That is, the 90° pulse is applied from the $(2n\phi+\pi/2)$ direction as shown by a broken line in FIG. 10A and the 180° pulse is applied from the $(n\phi-\pi/2)$ direction as shown by a broken line in FIG. 10B. As can be seen, the phase difference between the 90° pulse and the 180° pulse is changed in increments of $\phi$ with each encoding step. Thereby, as shown in FIG. 10B, the echo signal f based on the 90° and 180° pulses is produced in the $\theta=0$ (x'-axis) direction, while the FID signal fz based on the 180° pulse is produced in the $\theta=n\phi$ direction.

Figure 1:
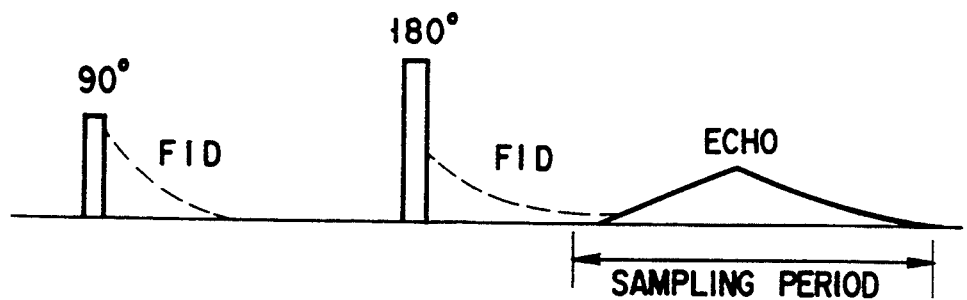
FIG. 1 illustrates the leakage of an FID signal from a 180° pulse in a spin-echo technique.
Figure 2:
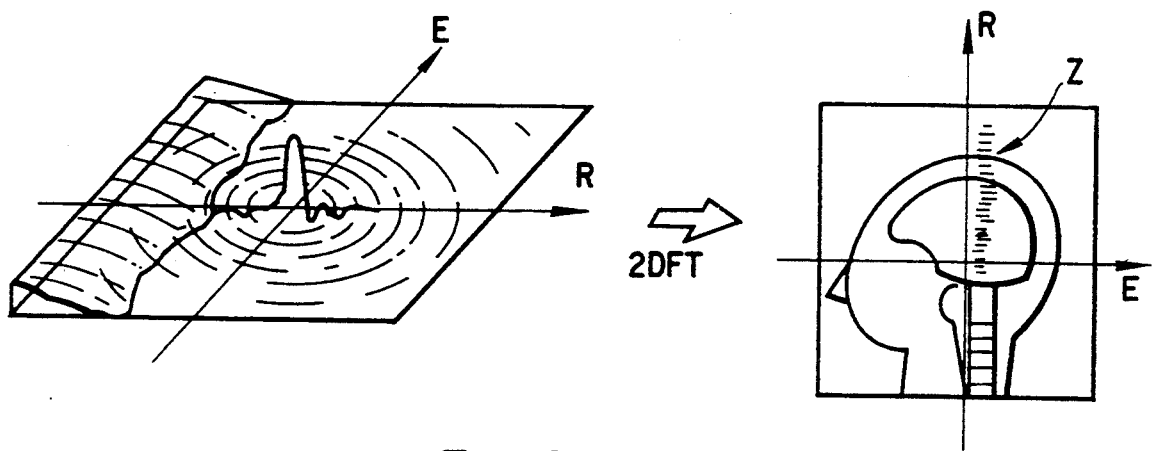
FIG. 2 is a diagram for use in explanation of a zipper artifact due to the leakage of the FID signal shown in FIG. 1.
Figure 3A:
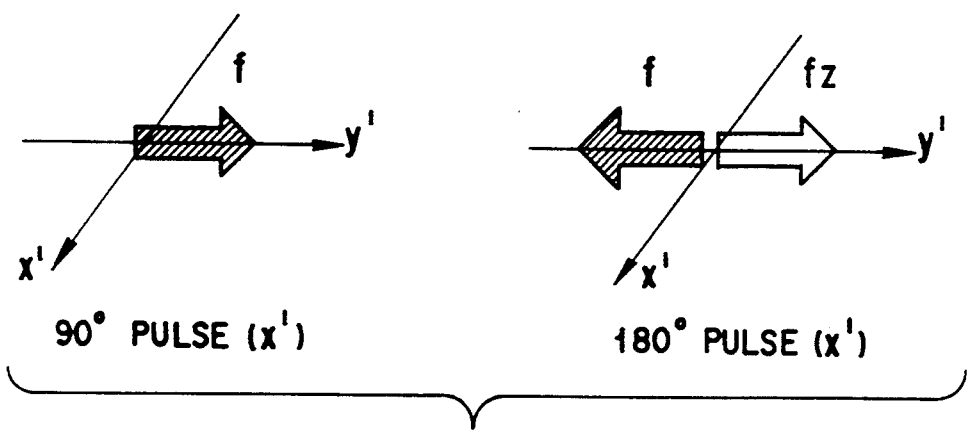
Figure 11:
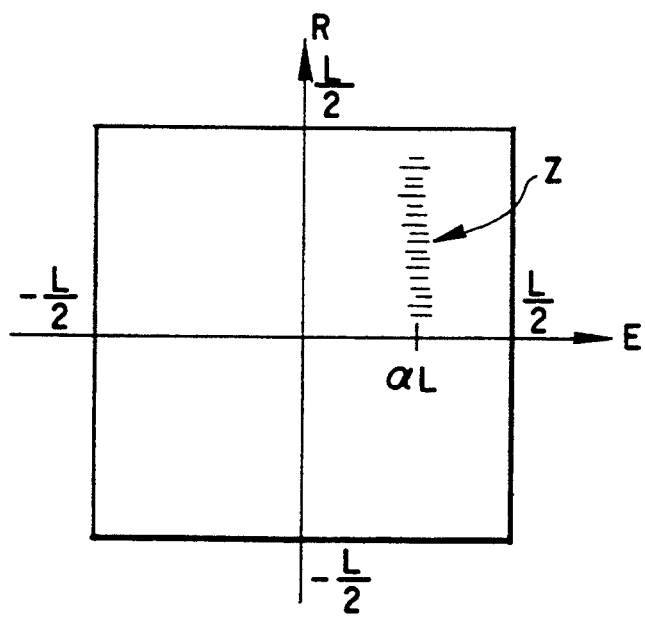
FIG. 11 illustrates a shift of position where the zipper artifact is produced in accordance with the first embodiment.

When an MR image is reconstructed through two-dimensional transform of acquired data, a zipper artifact is produced in the neighborhood of the center (the zero frequency in the encoding direction) of the image when $\phi=0$ as shown in FIG. 2. When $\phi=\pi$, on the other hand, the zipper artifact is produced in the neighborhood of the periphery (the highest frequency in the encoding direction) of the image as shown in FIG. 4. Thus, it will be seen that, supposing that $\alpha=\phi/2\pi$ $(-\frac{1}{2}\leq\alpha\leq\frac{1}{2})$, the zipper artifact Z is produced in a position of $\alpha L$ $(=\phi L/2\pi)$ in the encoding direction as shown in FIG. 11. In other words, in order to shift the position where the zipper artifact is produced to the position of $\alpha/L$ in the encoding direction, it is only required that, with $\phi=2\pi\alpha$, the phases of the RF pulses in the n-th encoding step be set at $2n\phi+\pi/2$ (or $2n\phi-3\pi/2$) for the 90° pulse and $n\phi-\pi/2$ for the 180° pulse. L is given by equation (1).

According to the first embodiment of the present invention, as described above, by setting the phases of the 90° and 180° RF pulses so that their phase difference may change in increments of $\phi$ with each encoding step, the position where a zipper artifact, based on an FID signal dependent upon the 180° pulse in the spin-echo imaging method, is produced can be shifted to a position corresponding to the phase difference $\phi$ in the encoding direction. Therefore, the phase difference can be changed according to the property of a diagnostic image to shift a zipper artifact to any desired position. In the case of off-center imaging as well, an artifact can be produced in a peripheral position with little influence on observation. Thereby, there is provided a magnetic resonance imaging apparatus which suffers little from deterioration in image quality due to an artifact.

Other embodiments of the present invention will be described hereinafter. The other embodiments are the same in configuration of apparatus as the first embodiment, and hence the description of the configuration of apparatus is omitted here.

In a second embodiment, the phases of the RF pulses in the n-th encoding step are set as follows:

$[\pi/2]_{n\phi+\pi/2}$ $[\pi]_{-\pi/2}$

Figure 12A:
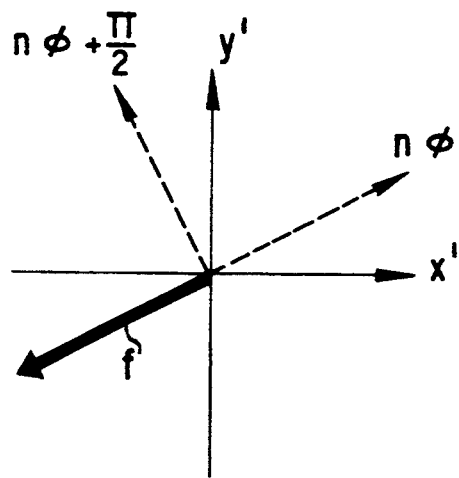
FIGS. 12A and 12B illustrate the principle of a shift of position where a zipper artifact is produced in accordance with a second embodiment of the present invention.
Figure 12B:
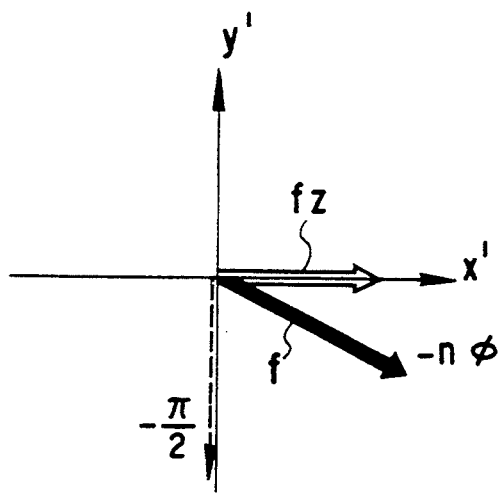

That is, the 90° pulse is applied from the $(n\phi+\pi/2)$ direction as shown in FIG. 12A, and the 180° pulse is applied from the $(-\pi/2)$ direction as shown in FIG. 12B. Thereby, as shown in FIG. 12B, an echo signal f based on a 90° and 180° pulses is produced in the ($\theta = -n\phi$) direction, while an FID signal based on a 180° pulse is produced in the ($\theta = 0$) direction.

If, at this point, an echo signal f acquired in the n-th encoding step is multiplied by $\exp(in\phi)$, then the phases of the echo signal f and the FID signal fz will be shifted to $\theta = 0$ and $\theta = n\phi$, respectively, in accordance with the shift theorem of the Fourier transform. This result is the same as that of the first embodiment. That is, as with the first embodiment, a zipper artifact can be produced in any position of $\alpha L$.

A third embodiment is directed to a multi-echo (for example, two echoes) pulse sequence. In the third embodiment, the phases of RF pulses (a $\pi/2$ pulse, a first $\pi$ pulse, and a second $\pi$ pulse) are set as follows:

$[\pi/2]_{2n\phi - 3\pi/2}$ $(= [\pi/2]_{2n\phi + \pi/2})$ $[\pi]_{n\phi - \pi/2}$ $[\pi]_{-n\phi + \pi/2}$ It is noted that the phases of the $\pi/2$ pulse and the first $\pi$ pulse are the same as those in the first embodiment.

Figure 13:
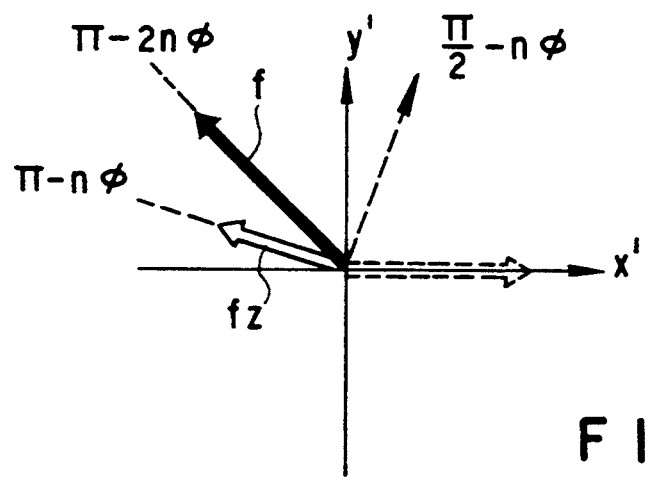
FIG. 13 illustrates the principle of a shift of position where a zipper artifact is produced in accordance with a third embodiment of the present invention.

As a result, as shown in FIG. 13, an echo signal f is produced in the ($\pi - 2n\phi$) direction, while an FID signal fz is produced in the ($\pi - n\phi$) direction.

If, at this point, an echo signal f acquired in the n-th encoding step is multiplied by $\exp(i \times (2n\phi - \pi))$, then the phases of the echo signal f and the FID signal fz will be shifted to $\theta = 0$ and $\theta = n\phi$, respectively. This result is also the same as that of the first embodiment. That is, as with the first embodiment, a zipper artifact can be produced in any position $\alpha L$.

The same is the case with a multi-echo method adapted for three or more echoes. For example, supposing that the (k−1)st echo signal is produced in the $\theta n^{(k-1)}$ direction, it is required that the phase of the k-th $\pi$ pulse be set at $\theta n^{(k-1)} + (\pi/2 - n\phi)$.

The above embodiments are adapted to shift a position where an artifact is produced in two-dimensional space (E-R space). Hereinafter, description will be made of a fourth embodiment which is adapted to shift a position where an artifact is produced in three dimensional space.

In three-dimensional space, a zipper artifact based on an FID signal is produced in such a position as shown in FIG. 14. This type of artifact is formed along the read-axis direction, with the read axis omitted, therefore, the zipper artifact will be produced at the intersection of the encode axis E and the slice axis S as shown in FIG. 15. Such a shift of the artifact-produced position to a position ($\alpha L$, $\beta L'$) as shown in FIG. 16 will be described.

At this point, suppose that L is given by equation (1) and parameters in the pulse sequence are defined as shown in FIG. 11. Then, the following relationship will hold.

$$T \times \Delta Gs \times L' = 1 \quad (2)$$

where

T': length of time that a phase-encoding gradient magnetic field is applied in the direction of the slice thickness, seconds ΔGs: unit step in the direction of the slice thickness, Hz/cm L': image field in the direction of the slice thickness, centimeters Suppose that, as in the first embodiment adapted for two-dimensional space, encoding steps are repeated N times in the frequency-encoding direction from $n = -(N/2+1)$ to $n = N/2$ and M times in the direction of the slice thickness from $m = -(M/2+1)$ to $m = M/2$. Then, the phases of RF pulses in the n-th encoding step are set as follows:

$[\pi/2]_{(2n\phi + 2m\psi) - 3\pi/2}$ $[\pi]_{(n\phi + m\psi) - \pi/2}$ where $\phi = 2\pi\alpha$ $\psi = 2\pi\beta (-\frac{1}{2} \leq \beta \leq \frac{1}{2})$ Thereby, the zipper-artifact-produced position can be shifted to a position ($\alpha L$, $\beta L'$) as is the case with the first embodiment. The proper setting of $\alpha$ and $\beta$ permits an artifact to be shifted to the periphery of an MR image.

Likewise, application of the second and third embodiments will shift an artifact-produced position in three dimensional space.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, although, in the second and third embodiments, the phase of an echo signal was corrected in the Fourier space prior to its Fourier transform to shift the echo signal f to $\theta = 0$, an artifact may be shifted in real space after Fourier transform.

According to the present invention, as described above, there is provided a magnetic resonance imaging apparatus which can shift a zipper artifact to any position in an MR image and lessen the influence of the zipper artifact on the MR image.

What is claimed is:

1. A magnetic resonance imaging apparatus adapted for a spin-echo method using a selective excitation pulse and a refocus pulse as radio-frequency pulses comprising:

sequence control means for carrying out a spin-echo pulse sequence while changing the phases of the RF pulses with each encoding step so that the phase difference between the selective excitation pulse and the refocus pulse is changed in increments of a fixed angle with each encoding step; and means for reconstructing an MR image on the basis of signals acquired in accordance with the spin-echo pulse sequence carried out by said sequence control means, whereby a phase difference between an echo signal induced by the selective excitation pulse and an FID (free induction decay) signal induced by the refocus pulse is changed in increments of said fixed angle with each encoding step, and an artifact based on the FID signal is produced in a position corresponding to said phase difference with respect to an image based on the echo signal.

2. An apparatus according to claim 1, in which said sequence control means, when performing frequency encoding N times from N/2)+1 to N/2, sets the phases of the selective excitation pulse and the refocus pulse in each encoding step n at $2n\phi - 3\pi/2$ ($=2n\phi + \pi/2$) and $n\phi - \pi/2$, respectively, $\phi$ being a predetermined value, whereby the artifact is produced in a position of $[\alpha L (=\phi L/2\pi)]$ $\phi L/2\pi$ in the frequency encoding direction, L indicating the image field in the encoding direction.

3. An apparatus according to claim 1, in which said sequence control means, when performing frequency encoding N times from (N/2)+1 to N/2, sets the phases of the selective excitation pulse and the refocus pulse in each encoding step on ($=-(N/2)+1$ to N/2) at $n\phi + \pi/2$ and at $-\pi/2$, respectively, $\phi$ being a predetermined value, and said reconstructing means multiplies a signal acquired in each encoding step by exp (in$\phi$) prior to reconstruction processing, whereby the artifact is produced in a position of $[\alpha/L (=\phi L/2\pi)]$ $\phi L/2\pi$ in the frequency encoding direction, L indicating the image field in the encoding direction.

4. An apparatus according to claim 1, in which said pulse sequence control means performs a multi-echo pulse sequence using a selective excitation pulse and first and second refocus pulses and, when performing frequency encoding N times from (N/2)+1 to N/2, sets the phases of the selective excitation pulse and the first and second refocus pulses in each encoding step n ($=-(N/2)+1$ to N/2) at $2n\phi - 3\pi/2$ ($=2n\phi + \pi/2$), $n\phi - \pi/2$ and $-n\phi + \pi/2$, respectively, $\phi$ being a predetermined value, and said reconstructing means multiplies a signal acquired in each encoding step n by exp-(i×(2n$\phi - \pi$)) prior to reconstruction processing, whereby the artifact is produced in a position of $[\alpha/ (=\phi L/2\pi)]$ $\phi L/2\pi$ in the frequency encoding direction, L indicating the image field in the encoding direction.

5. An apparatus according to claim 4, in which said sequence control means, when the (k−1)st echo signal is produced at a phase of $\theta n^{(k-1)}$, sets the phase of the k-th refocus pulse at $\theta n^{(k-1)} + \pi/2 - n\phi$.

6. An apparatus according to claim 1, in which said sequence control means, when performing frequency encoding in the frequency encoding direction N times from $-(N/2+1)$ to N/2 and in the slice direction M times from $-(M/2+1)$ to M/2, sets the phases of the selective excitation pulse and the refocus pulse in each encoding step n at $(2n\phi + 2m\Psi) - 3\pi/2$ and $(n\phi + m\Psi) - \pi/2$, respectively, $\phi$ and $\Psi$ being predetermined values, whereby the artifact is produced in a position of $[\alpha/L (=\phi L/2\pi)]$ $\phi L/2\pi$ in the frequency encoding direction and $\beta L' (=\Psi L'/2\pi)$ in the slice direction, L indicating the image field in the encoding direction, and L' indicating the image field in the slice direction.

7. A magnetic resonance imaging method for acquiring magnetic resonance signals from an object under examination to obtain an MR image, comprising:

acquiring a first signal necessary for imaging and a second signal unnecessary for imaging;

changing the phase difference of said first and second signals in increments of a predetermined amount with each encoding step; and obtaining an image from the first signal and an image from the second signal;

wherein the relative positional relationship between said images from said first and second signals is dependent on said predetermined amount of phase difference.

8. A method according to claim 7, in which the first signal is acquired at a phase angle of 0 and the first signal is acquired at a phase angle of $-n\phi$ with each encoding step, n being the encoding step number and $\phi$ being a predetermined angle.

9. An apparatus according to claim 7, in which the second signal is acquired at a phase angle of 0 and the first signal is acquired at a phase angle of $-n\phi$ with each encoding step, n being the encoding step number and $\phi$ being a predetermined angle.

10. A method according to claim 7, in which the first signal is acquired at a phase angle of $\pi - \phi$ and the second signal is acquired at a phase angle of $\pi - 2n\phi$ with each encoding step, n being the encoding step number and $\phi$ being a predetermined angle.

11. A magnetic resonance imaging method comprising the steps of:

(a) applying a selective excitation pulse and a refocus pulse to acquire an echo signal, the phase difference between the selective excitation and refocus pulses being kept at a predetermined angle $\phi$;

(b) repeating step (a) a number of times corresponding to the number of frequency encoding steps with the phase difference between the selective excitation pulse and refocus pulse being changed in increments of the predetermined angle $\phi$ with each encoding step; and (c) reconstructing an MR image on the basis of magnetic resonance signals obtained in step (b).

12. A method according to claim 11, in which an artifact based on an FID signal induced by the refocus pulse is produced in a position of $\phi L/2\pi$ where L is the image field in the frequency encoding direction when the step (b) shifts the phase difference between the selective excitation pulse and refocus pulse in increments of $\phi = 2\pi$ times a constant with each encoding step.

* * * * *